United States Patent [19]

Isono et al.

[11] Patent Number: 5,091,880
[45] Date of Patent: Feb. 25, 1992

[54] MEMORY DEVICE

[75] Inventors: Yasuo Isono, Fussa; Toshihito Kouchi, Tama; Akitoshi Toda, Kunitachi; Hiroshi Kajimura, Tokyo; Yoshiyuki Mimura; Hiroko Ohta, both of Hachioji; Ryouhei Shimizu, Koshigaya, all of Japan

[73] Assignee: Olympus Optical Co., Ltd., Tokyo, Japan

[21] Appl. No.: 471,841

[22] Filed: Jan. 29, 1990

[30] Foreign Application Priority Data

Feb. 2, 1989 [JP] Japan .................................. 1-24554
Feb. 10, 1989 [JP] Japan .................................. 1-32255

[51] Int. Cl.$^5$ ......................... G11C 7/00; G11B 11/00
[52] U.S. Cl. .................................... 365/151; 369/126
[58] Field of Search ................ 365/151, 174; 369/126

[56] References Cited

U.S. PATENT DOCUMENTS 4,575,822  3/1986  Quate ................................. 365/174
4,916,688  4/1990  Foster et al. ........................ 369/126

OTHER PUBLICATIONS

D. W. Abraham et al., "Surface Modification with the Scanning Tunneling Microscope", IBM J. Res. Develop., vol. 30, No. 5, Sep. 1986, pp. 492-499.
U. Staufer et al., "Surface Modification in the Nanometer Range by the Scanning Tunneling Microscope", J. Vac. Sci. Technol. A, 6(2), Mar./Apr. 1988, pp. 537-539.

Primary Examiner—Joseph A. Popek
Attorney, Agent, or Firm—Frishauf, Holtz, Goodman & Woodward

[57] ABSTRACT

A memory device comprises a base plate with a memory element supporting layer, a probe with a pointed tip portion, and a fine scan element for causing the probe to scan over the surface of the memory element supporting layer. When the probe is approached to the surface of the memory element supporting layer and a suitable bias voltage is applied across the probe and the memory element supporting layer, a tunnel current is cause to flow therebetween and a specific region of the surface of the supporting layer is excited. The excited region can adsorb one molecule of, for example, di-(2-ethylhexyl)phthalate. By causing the memory element to be adsorbed selectively on the memory element supporting layer, data is recorded in the form of a projection-and-recess pattern. The recorded data can be read out by observing the surface configuration of the supporting layer in accordance with the principle of an STM (scanning tunneling microscope).

14 Claims, 4 Drawing Sheets

MEMORY DEVICE

BACKGROUND OF THE INVENTION

1. Field of the Invention

The present invention relates to a memory device having an uneven pattern.

2. Description of the Related Art

With a recent development of an information-oriented society, the amount of data processed in computers increases more and more. To meet the demand under the circumstances, various types of large-capacity memories such as 16 M bit DRAMs or optical disc memories have been developed. Also, it is required that the memories be accessed at high speed for high-speed data processing.

In order to increase the memory capacity of a recording medium, it suffices if the size of the recording medium is increased. However, if the size of the recording medium increases, there occur electrical problems such as an increase in parasitic capacitance or parasitic inductance, and mechanical problems such as an increase in range of operation. Consequently, the access speed of the memory decreases. Under the circumstances, the reduction in size of the memory has been developed for attaining the high-speed memory access.

For example, the access speed of the memory using electric circuits is increased by integrating the circuits on a semiconductor substrate. Also, the high-speed memory access of an optical disc memory is achieved by reducing the size of a data record region (memory pit) and increasing the density of memory pits. However, the reduction in size of the memory and the increase in access speed by means of these techniques are close to the limits.

In general, in the memory using electric circuits, a lithographic method is used to form a design pattern on a semiconductor substrate. In this method, the finer the design pattern becomes, the less ignorable the interference of light (electromagnetic wave) radiated from a light source becomes. As a result, the reduction of the width of wiring lines is limited. On the other hand, in the optical disc memory, memory pits are formed, for example, by radiating a laser beam with a small diameter onto a material, thereby forming pits with an uneven configuration or changing physical properties such as reflectivity or refractive index. In this case, too, the reduction of the diameter of a beam is limited by the interference of light (laser beam), and accordingly the reduction of the size of each memory pit is limited.

A scanning tunneling microscope (STM) is known as a surface observation device with high resolution. When a pointed tip of a metal probe is approached to the surface of a workpiece at a distance of about 1 nm, and a voltage is applied across the probe and the workpiece, electrons are allowed to flow through a gap (tunnel effect), which was considered impossible from the view-point of classical mechanics, and a tunnel current flows therebetween. The ST takes advantage of this tunnel effect. The probe is moved in three-dimensional directions while detecting the tunnel current to observe the surface configuration of the workpiece. The resolution of the STM is about 0.1 nm, and the atomic arrangement of the surface of the workpiece can be observed. It has been proposed that a memory be manufactured according to the principle of the STM with high resolution.

U.S. Pat. No. 4,575,822 (to Quate) discloses a method and an apparatus for recording data, wherein a voltage is applied across an electrically conductive probe and a substrate capable of holding electric charge, and perturbation is caused in the substrate by a tunnel current flowing therebetween. Data is recorded in accordance with the presence/absence of the perturbation. Since this method utilizes the variation in work function of the substrate due to an electric field, the size of a memory bit is considerably greater than that of an atom. For example, in the case of a substrate with a capacitance of 1 mF per 1 cm$^2$, the density of charge becomes $10^{-8}/Å^2$, when the potential of charge in the substrate is set to 10 mV or more to avoid thermal disturbance. In other words, the area affected by an electric field of one electron, i.e. the size of a memory pit, is $10^8 Å^2$. Thus, the atomic-level resolution of the STM is not fully utilized.

SUMMARY OF THE INVENTION

The object of the present invention is to provide a memory in which the recording density is increased while the access speed is not decreased.

A memory device according to the invention comprises a supporting member having a plurality of memory blocks. Each of the memory blocks including a recording medium provided on the supporting member, a probe, supported in the vicinity of the recording medium, for writing data on the recording medium or reading data therefrom, means for scanning the probe across the recording medium, and a light-receiving element connected to the scanning means for activating the probe to perform a data write/read operation upon receiving light. The memory device according to the invention further comprises optical means for radiating light selectively on the light-receiving elements of the memory blocks.

Additional objects and advantages of the invention will be set forth in the description which follows, and in part will be obvious from the description, or may be learned by practice of the invention. The objects and advantages of the invention may be realized and obtained by means of the instruments and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Preferred embodiments of the present invention will now be described with reference to the accompanying drawings.

Figure 1:
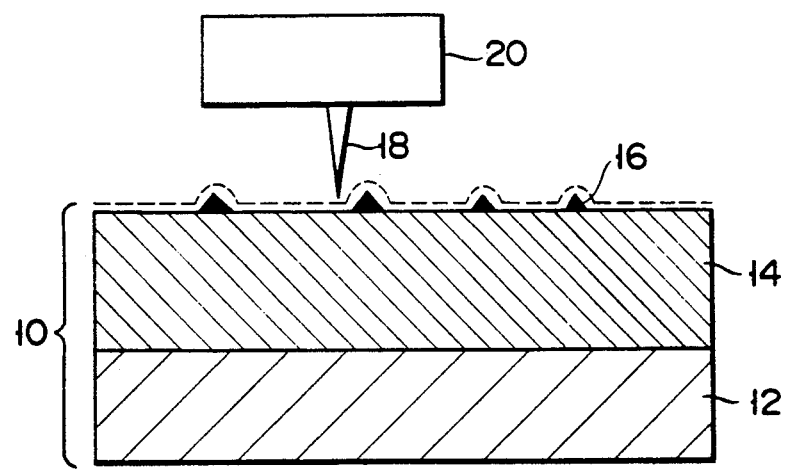
FIG. 1 shows a basic structure of a memory of the present invention.

As shown in FIG. 1, a memory according to the present invention basically comprises a base plate 10, a probe 18 and a fine scan element 20. The base plate 10 comprises a substrate 12 and a memory element supporting layer 14. The probe 18 is supplied with a suitable bias voltage. The fine scan element 20 causes the probe 18 to move in three-dimensional directions. Any type of substrate 12 may be used, if it can support the memory supporting layer 14. The substrate 12 may be dispensed with, if the memory element supporting layer 14 itself has sufficient strength. In this case, the layer 14 itself may be used as a substrate.

Data is recorded such that a memory element 16 is adsorbed selectively on the base plate 10 (more specifically, the memory element supporting layer 14). Data is erased such that the memory element 16 is removed from the base plate 10. A method of adsorbing/removing the memory element 16 on/from the base plate 10 was disclosed by J. S. Foster et al. in NATURE, vol 331, page 324, 1988. According to this method, one molecule of di-(2-ethylhexyl) phthalate can be adsorbed on a specific region of the surface of a graphite base plate excited by means of a tunnel current. Also, the adsorbed molecule of di-(2-ethylhexyl) phthalate is removed by applying a suitable bias voltage to the probe.

Since data is recorded on the memory element carrying layer 14 in the form of projections and recesses at the order of molecules, it is necessary that the surface of the memory element supporting layer 14 have exact flatness. Unevenness of the surface of the base plate adversely affects the S/N of data reading. Thus, a monomolecular film of graphite, metal or organic material, which ensures excellent flatness, may be used as the memory element supporting layer 14. In particular, an LB film formed by means of a Langmuir-Blodgett's technique (LB technique) is desirable. The LB film has a structure wherein monomolecular films of chain molecules of hydrocarbon, each having hydrophobic property at one end and hydrophilic property at the other, are regularly arranged. Theoretically, the surface of the LB film has a flatness of molecular order. A high S/N can be ensured by the use of the LB film.

The memory element 16 comprises an aggregate of molecules of one or more chemical substances. Desirable chemical substances are di-(2-ethylhexyl) phthalate, benzen, TTF-TCNQ, phthalocyanine, liquid crystal compound, and protein. When the molecule of a chemical substance is used as the memory element 16, the size of a memory pit can be reduced to the size of one molecule at a minimum. For example, if the molecule of di-(2-ethylhexyl) phthalate is used as the memory element, the size of the memory pit is 4 Å×4 Å. Accordingly, the recording density becomes very higher, and the memory capacity increases. Namely, it is possible to obtain about $10^8$ times the memory capacity of a currently available optical disc memory.

If the memory element supporting layer 14 is formed of an organic LB film and the memory element 16 is formed of an organic substance so that the characteristics of both are made similar to each other, the adsorption and removal of the memory element 16 on/from the base plate 10 becomes easier. Also, if the memory element 16 is attached to the base plate 10 by means of chemical bonding or polymerization, natural removal of the memory element 16 can be prevented for a long time. This type of memory device is applicable to a ROM which must have high durability.

A tip portion of the probe 18 has a radius of curvature of about 0.1 μm, and it is desirable that at least 1 μm of the tip portion be tapered. The probe may be manufactured by means of electropolishing, like a probe used for a field emission microscope, or it may be manufactured by means of mechanical polishing.

Figure 2:
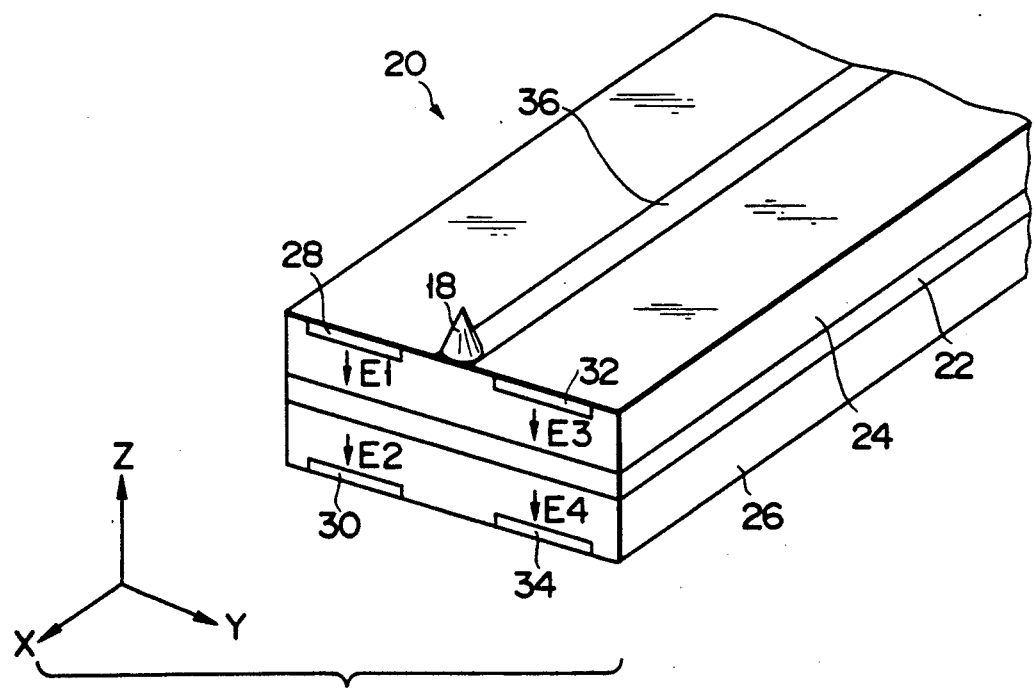
FIG. 2 is a perspective view showing a fine scan element shown in FIG. 1.

The fine scan element 20 is an actuator for microscopic positional control and scanning of the probe 18. The fine scan element 20 is formed of, e.g. piezoelectric material. FIG. 2 shows an example of the fine scan element 20. Piezoelectric elements 24 and 26 are arranged with an electrode interposed therebetween. Two electrodes 28 and 32 are formed in an upper surface portion of the piezoelectric element 24, and two electrodes 30 and 34 are formed in a lower surface portion of the piezoelectric element 26. The probe 18 is disposed at a front middle portion of the fine scan element 20. The probe 18 is connected to an STM (scanning tunneling microscope) drive circuit through a line 36. For example, when an electric field is applied to the piezoelectric elements 24 and 26 in a direction from electrode 28 to electrode 30, the piezoelectric elements 24 and 26 extend in the direction of the X-axis (shown in FIG. 2). By virtue of this property, a suitable voltage is applied to the electrodes 22, 28, 30, 32 and 34 so that the fine scan element 20 can be moved (or scanned) in three-dimensional directions. The relationship between the intensities of electric field vectors E1, E2, E3 and E4 and the scan direction of the fine scan element 20 is as follows:

$X$: Positive Direction $E1=E2=E3=E4>0$

Negative Direction $E1=E2=E3=E4<0$ $Y$: Positive Direction $E1=E2>E3=E4$

Negative Direction $E1=E2<E3=E4$ $Z$: Positive Direction $E1=E2<E3=E4$

Negative Direction $E1=E2>E3=E4$

The data read operation of the memory will now be described. The tip portion of probe 18 is caused to approach the surface of base plate 10 at a distance of about 1 nm. A bias voltage is applied across the probe 18 and the base plate 10, so that a tunnel current flows therebetween. The tunnel current changes delicately in accordance with the distance between the tip of probe 18 and the base plate 10. The projections and recesses of the surface of base plate 10, i.e. recorded data, can be read by virtue of this property of the tunnel current. For example, the probe is caused to scan over the surface of the base plate by means of the fine scan element 20, while the distance between the probe and the base plate is being adjusted to keep the tunnel current constant. In this case, the tip portion of the probe moves over the uneven surface of the base plate at a predetermined distance from the surface of the base plate. On the basis of the voltage applied to the fine scan element 20, an image of an uneven surface representative of the configuration of the surface of the base plate can be obtained.

Thus, the unevenness of the surface of the base plate is read out as recorded data.

Figure 3:
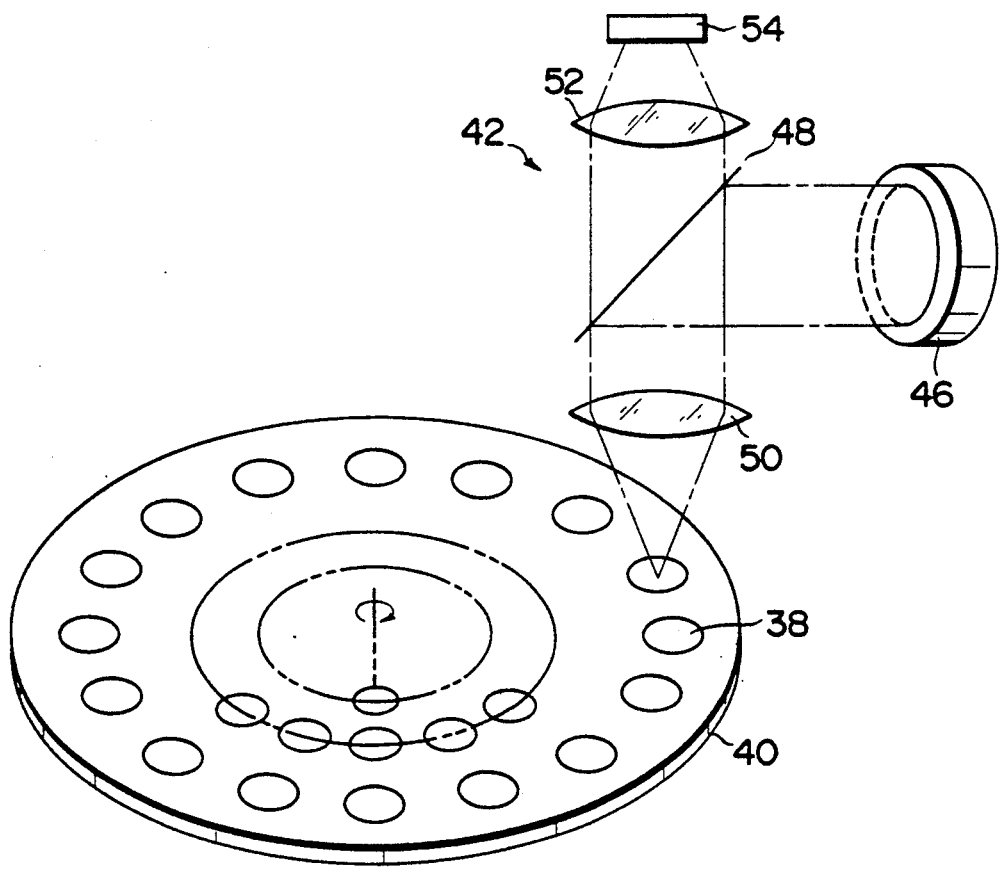
FIG. 3 shows a memory device wherein a number of memory blocks are arranged on a single recording disc.
Figure 4:
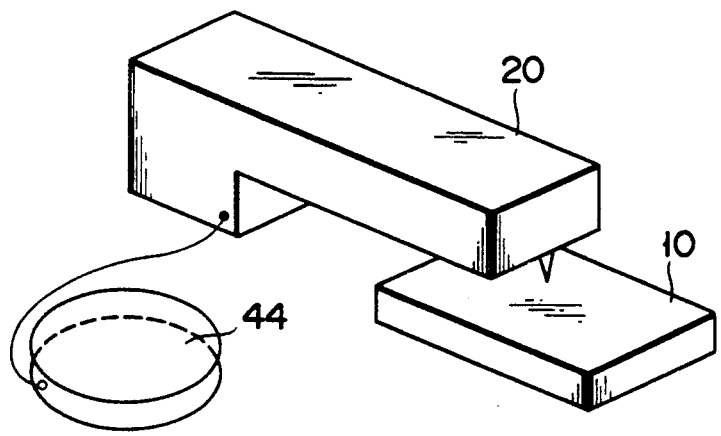
FIG. 4 shows a basic structure of the memory block arranged on the recording disc shown in FIG. 3.

FIG. 3 shows a memory device wherein a plurality of memories are provided on a single disc. The memory device comprises a recording disc 40 with memory blocks 38, and an optical head 42 for selecting a given memory block 38. As schematically shown in FIG. 4, each memory block 38 comprises a pair of a fine scan element 20 and a base plate 10, and a light-receiving element 44 for starting a write/read operation upon receiving a light beam of a specific wavelength. The memory blocks 38 are arranged, for example, concentrically with a predetermined pitch. A given memory block 38 can be accessed by designating a track number and a sector number.

The optical head 42 is movable in the radial direction of the recording disc 40. A laser beam source 46 of the optical head 42 emits, in a pulsating manner, a detection light beam for detecting the position of a target memory block 38 and a drive light beam for performing a write/read operation having a wavelength different from that of the detection light beam. The detection light beam emitted from the laser beam source 46 is reflected by a half-mirror 48 and converged on the recording disc 40 by a first converging lens 50. The disc 40 has a mirror face in regions where the memory blocks 38 are not disposed, and the mirror face reflects the detection beam almost completely. The detection beam reflected by the recording disc 40 returns to the half-mirror 48 through the first converging lens 50. Half the detection beam is reflected by the half-mirror 48, and the other half passes through the half-mirror 48. The beam component, which has passed through the half-mirror 48, is guided through a second converging lens 52 to a received-light detector 54 for accessing a target memory block 38.

Figure 5:
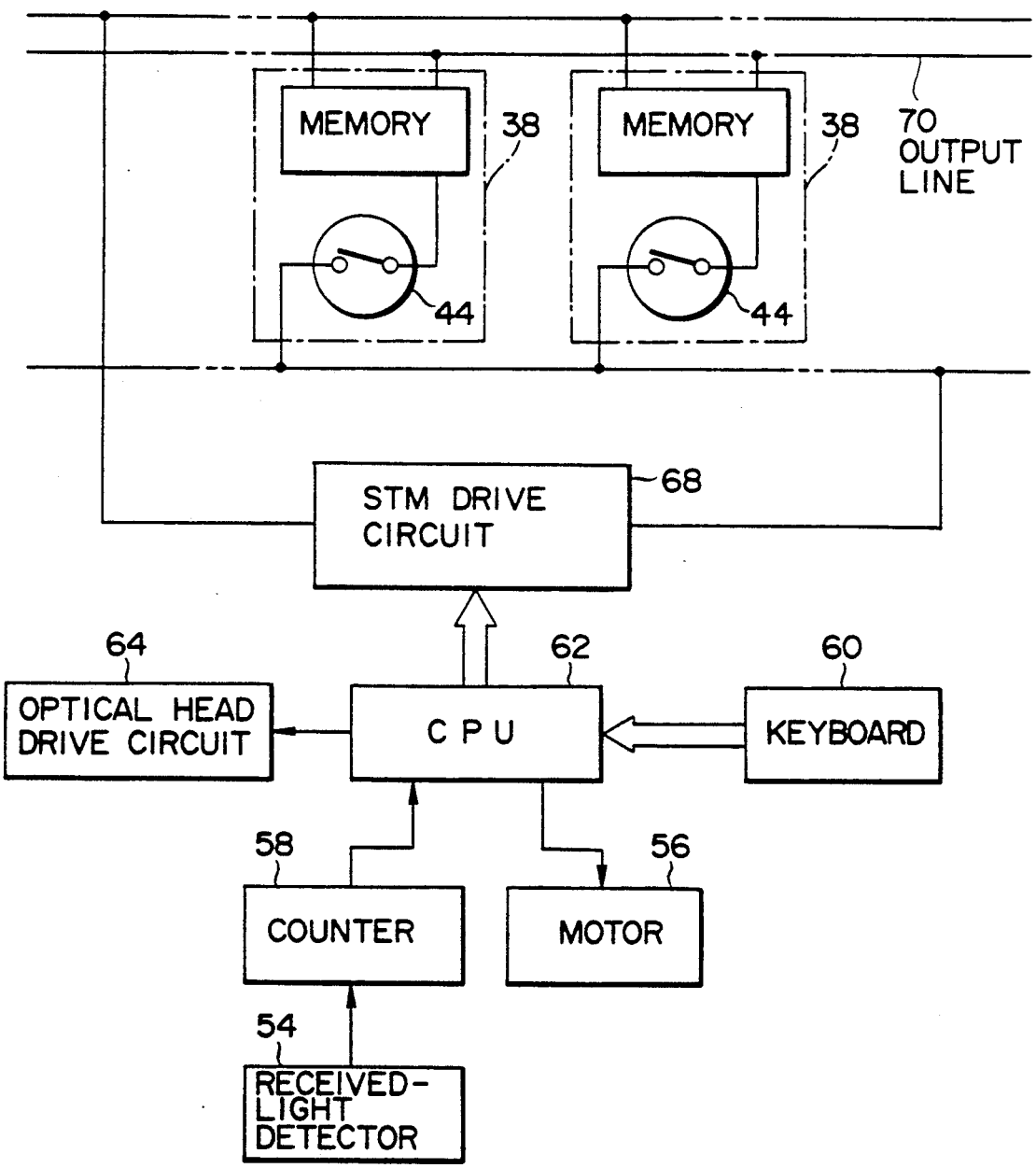
FIG. 5 is a block diagram showing a circuit for accessing a specific memory block on the recording disc shown in FIG. 3.

The operation for accessing the target memory block 38 will now be described with reference to FIG. 5. The recording disc 40 is rotated at a predetermined angular speed by a motor 56. The optical head 42 is moved in the radial direction (e.g. radially outward direction) of the recording disc 40, while it radiates the detection beam onto the disc 40. In this case, the intensity of the detection beam input to the received-light detector 54 varies in a pulse-like manner when the beam crosses the track of the memory block 38. The change in intensity of the detection beam is detected by the received-light detector 54, and the number of pulses is counted by a counter 58. The positional data (track number and sector number) of the memory block 38 to be accessed is input in advance from a keyboard 60 and is processed in a CPU 62. Thus, the number of the track above which the head 42 is to be fixed is determined. An optical head drive circuit 64 is controlled by the CPU 62, and the operation of the drive circuit 42 is stopped when the count value of the counter 58 indicates that the optical head 42 is located on the target track. Then, the optical head 42 is fixed above the track. This optical head 42 detects a home position recorded on the disc 40 track by track. Further, on the same track, the intensity of the detection beam varies in a pulse-like manner, when it passes the memory block 38. Thus, the number of pulses is counted by the counter 58 as a sector number, beginning from the home position. Consequently, the target memory block 38 is selected. When the selected memory block 38 comes to the focal point of the optical head 42, the laser beam source 46 emits a drive pulse beam of a specific wavelength, in order to drive the light-receiving element 44. When the light-receiving element 44 receives the beam of the specific wavelength, the STM drive circuit 68 starts the data write/read operation in the above-described manner. A number of memory blocks 38 on the disc 40 are connected, block by block (e.g. track by track), to output lines 70. The number of output lines 70 is the same as the number of blocks (e.g. tracks). The output lines 70 are connected to conductors in a rotational shaft (not shown) of the recording disc 40, and are led to an external device through a mercury switch, a brush, or the like. In FIG. 5, although the STM drive circuit 68 is connected in parallel to the memory blocks 38, only a specific memory blocks 38 is operated since the light-receiving element 44 is switched upon receiving the drive pulsatile beam.

The access speed of each memory block 38 is substantially equal to the read speed in a conventional optical disc. The read speed in each memory block 38 is higher than the read speed in a conventional STM memory. The reason for this is that, since the fine scan element 20 is manufactured very finely in a semiconductor IC process, the mechanical operation range becomes small, and the parasitic capacitance and parasitic inductance of the electric circuits are decreased. As a result, the memory capacity can be remarkably increased without lowering the access speed.

Figure 6:
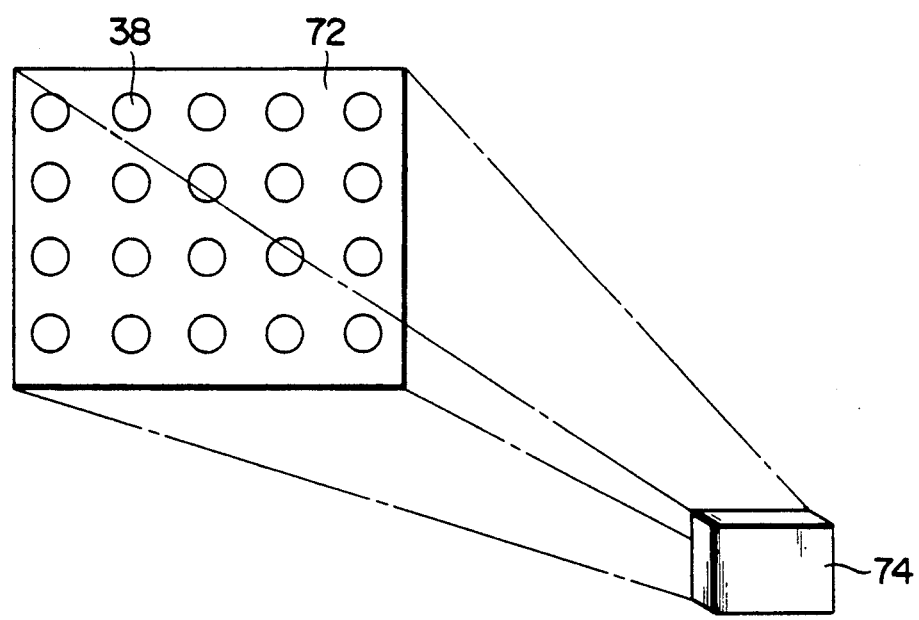
FIG. 6 shows another embodiment of a memory device wherein a number of memory blocks are arranged on a single board.

FIG. 6 shows another embodiment of the invention. As in the above embodiment, each of a plurality of memory blocks 38 provided on a recording board 72 has a light-receiving element 14. When the light-receiving element 44 receives a beam of a specific wavelength, a write/read operation is started. In this embodiment, an optical pattern generated from an optical pattern generator 74 is projected on the recording board 72, and one or more memory blocks 38 which have received light on the basis of the optical pattern are simultaneously operated. An optical mask (transparency), a photographic projector, a hologram image generator or the like may be used as the optical pattern generator 74. Since a plurality of memory blocks 38 can be simultaneously accessed, the memory device of this embodiment is suitable for a parallel arithmetic operation computer. In particular, since the parallel access function is very advantageous in arithmetic operations of vector data, this memory device is applicable to an image processing device, an associative arithmetic operation device, an AI device, etc.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A memory device comprising:
    a supporting member having a plurality of memory blocks, each of the memory blocks including:
        a recording medium provided on the supporting member;
        a probe, supported in the vicinity of the recording medium, for writing data on the recording medium or reading data therefrom;
        scanning means for scanning the probe across the recording medium; and
        a light-receiving element connected to the scanning means for activating the probe to perform a data write/read operation upon receiving light; and optical means for radiating light selectively on the light-receiving elements of said memory blocks.

2. A memory device according to claim 1, wherein said supporting member comprises a rotatable disk member, and said memory blocks are arranged along a plurality of concentric circles on said disk member at a predetermined pitch.

3. A memory device according to claim 2, wherein said optical means comprises an optical head which is movable radially of the concentric circles.

4. A memory device according to claim 1, wherein said optical means comprises an optical pattern generator for radiating light onto the light-receiving elements at one time.

5. A memory device according to claim 4, wherein said optical pattern generator comprises an optical mask.

6. A memory device according to claim 4, wherein said optical pattern generator comprises a photographic projector.

7. A memory device according to claim 4, wherein said optical pattern generator comprises a hologram image generator.

8. A memory device comprising:

a supporting member having a plurality of memory blocks, each of the memory blocks including:
 a recording medium comprising a substantially flat portion of the supporting member;
 a probe, supported in the vicinity of the recording medium, for writing data on the recording medium or reading data therefrom;
 scanning means for scanning the probe across the recording medium; and
 a light-receiving element connected to the scanning means for activating the probe to perform a data write/read operation upon receiving light; and optical means for radiating light selectively on the light-receiving elements of said memory blocks.

9. A memory device according to claim 8, wherein said supporting member comprises a rotatable disk member, and said memory blocks are arranged along a plurality of concentric circles on said disk member at a predetermined pitch.

10. A memory device according to claim 9, wherein said optical means comprises an optical head which is movable radially of the concentric circles.

11. A memory device according to claim 8, wherein said optical means comprises an optical pattern generator for radiating light onto the light-receiving elements at one time.

12. A memory device according to claim 11, wherein said optical pattern generator comprises an optical mask.

13. A memory device according to claim 11, wherein said optical pattern generator comprises a photographic projector.

14. A memory device according to claim 11, wherein said optical pattern generator comprises a hologram image generator.

* * * * *